United States Patent [19]

Sargood

[11] Patent Number: 5,144,396
[45] Date of Patent: Sep. 1, 1992

[54] CAPPING LAYER FABRICATION

[75] Inventor: Stephen K. Sargood, Oakhurst, N.J.

[73] Assignee: British Telecommunications public limited company, London, England

[21] Appl. No.: 445,146

[22] Filed: Dec. 4, 1989

Related U.S. Application Data

[63] Continuation of Ser. No. 156,698, Feb. 17, 1988, abandoned.

[30] Foreign Application Priority Data

Feb. 17, 1987 [GB] United Kingdom ............... 8703592

[51] Int. Cl.⁵ .................. H01L 27/14; H01L 29/167; H01L 23/48; H01L 29/161
[52] U.S. Cl. ............................. 357/30; 357/63; 357/20; 357/68; 357/16
[58] Field of Search .............. 357/63, 68, 55, 58, 357/20, 30, 16, 67, 71

[56] References Cited

U.S. PATENT DOCUMENTS 4,499,483 2/1985 Yamazaki et al. ............... 357/30
4,624,004 11/1986 Calviello ......................... 357/20

FOREIGN PATENT DOCUMENTS 1177943 11/1984 Canada .
0060743 9/1982 European Pat. Off. .
0186460 7/1986 European Pat. Off. .
8505498 12/1985 World Int. Prop. O. .

OTHER PUBLICATIONS

IEEE Journal of Quantum Electronics, vol. QE-21, Nr. 2, Feb. 1985, pp. 138-143, New York, US, O. K. Kim et al. "A low dark-current, planar InGaAs p-i-n photodiode with a quaternary InGaAsP cap layer" pp. 138-139.
Patent Abstracts of Japan, vol. 0, No. 263 (E-351) [1986] Oct. 19, 1985; & JP-A060 110 177 (Fujitsu K.K.) Jun. 15, 1985.

Primary Examiner—Mark V. Prenty
Attorney, Agent, or Firm—Nixon & Vanderhye

[57] ABSTRACT

A planar, p-n junction device has electrical contact made to the active region, the capping layer (4) having been selectively removed through a mask (5, 6). The selective removal of the capping layer may be performed prior to a diffusion step in which the junction is formed, or the dopant may be diffused through the capping layer (4) and the selective removal performed subsequently. In the latter instance the capping layer (4) is preferably etched through a second mask (8,9) having a smaller window (9) in register with the window (6) in the mask layer (5) which is used for the diffusion stage. The device finds particular application as a photodiode detector in optical communications.

26 Claims, 2 Drawing Sheets

CAPPING LAYER FABRICATION

This is a continuation of application Ser. No. 07/156,698, filed Feb. 17, 1988, now abandoned.

This invention relates to semiconductor devices and in particular but not exclusively to planar PIN diodes.

For some structures, such as PIN diodes in optical receivers, it is necessary to have an isolated p-n junction. The p-n junction may be formed by growth of layers including the dopants or by subsequent diffusion processes. If the p-n junction is formed by complete adjacent layers on a wafer, the junction is commonly isolated by etching away surrounding material to leave a mesa. A problem encountered by this type of structure is that the exposed sides of the mesa tend to alter their electrical properties and give rise to leakage currents at the junction. This alteration will commence immediately the sides are exposed to the atmosphere and so subsequent application of protective layers does not eliminate the problem unless a protective layer can be applied before contact with the atmosphere.

An alternative structure is the planar diode in which the p-n junction is formed at a localised part of a wafer by diffusion of a dopant such as Zinc into the wafer through a window in a mask. With this technique the p-n junction itself is non-planar, defining a "pocket" of dopant. However, current leakage again tends to occur, this time where the edges of the junction emerge at the upper surface of the wafer, around the perimeter of the diffused region. The extent of the leakage current depends upon the surface leakage characteristics of the material and the quality of the interface between the semiconductor material and any overlying layer. Because their optical absorption is relatively high, ternary materials, particularly in GaAs, are preferred as the semiconductor material containing at least a large part of the junction. Surface leakage from InGaAs for this type of diode in optical receivers though is comparatively high, whereas leakage from other materials such as quaternary materials and, very notably, from indium phosphide, is much lower because of the larger band gap of these materials. In order to achieve the absorption of the ternary material with the lower leakage properties of another material a capping layer is grown in situ after the growth of the ternary layer. The diffusion of dopant is then performed through the capping layer into the ternary material.

A problem that occurs with capping layers is that it can be difficult to fabricate suitable electrical contact pads. For example if indium phosphide is used then titanium/gold contact pads do not provide satisfactory ohmic contact. Other metals such as zinc/gold alloys have been used but these do not exhibit the same reliability as titanium gold contacts on other materials: the zinc is not always electrically active and the gold tends to diffuse through indium phosphide and contaminate the semiconductor materials.

The present invention is directed towards establishing reliable contacts on capped planar diodes.

Accordingly the present invention provides a junction device comprising an active layer and an overlying capping layer, the junction being defined by a selectively doped area to lie at least partially in the active layer and extending to the surface of the active layer where it is covered by the capping layer, a window in the capping layer exposing a part of the surface of the active layer within the selectively doped area, and an electrical contact layer deposited on at least a part of the active layer exposed by the window.

Preferably the electrical contact layer comprises the first (titanium) layer of a titanium gold bilayer. This is because for applications where servicing is difficult, such as in submarine links, it is important to utilise the most reliable technology available and to this end it is preferred to utilise titanium/gold contact pads for electrical connection to the devices. With these contact pads a first layer of titanium acts to provide good contact to the device, gold then being chosen for the layer to which wires are attached because of its electrical conductivity and low reactivity.

The invention also provides a method of fabricating a junction device comprising the steps of forming an active layer and an overlying capping layer, selectively doping an area which lies at least partially in the active layer to form the junction, making a window in the capping layer to expose a portion of the selectively doped area in the active layer, which portion lies wholly within the boundary of said area, and depositing an electrical contact layer on to at least a part of the exposed selectively doped area.

Embodiments of the invention are now described by way of example with reference to the accompanying drawings in which FIG. 1 shows a cross section of the layer structure for a planar PIN diode;

(Cross-hatching has been omitted from the Figures for the sake of clarity).

Figure 1:
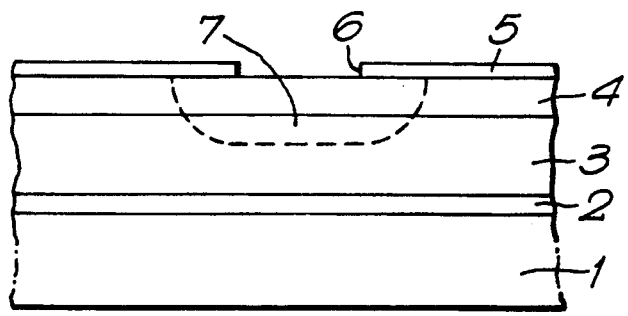

FIG. 1 shows a layer structure for a PIN diode of the type suitable for use in optical receivers and to which reliable, low resistance contacts need to be made.

Fundamentally the diode comprises an active layer within which incident light generates carrier pairs that are separated by the field of a p-n junction formed within the active region, and the photo current produced corresponds to the optical signal. The active layer is supported on a substrate and also has an overlying capping layer. Any current produced is detected by means of electrical contacts (not shown in FIG. 1) to the substrate and to the active layer via the capping layer.

The electrical contact to the active layer is created through a window in a dielectric (insulating) layer 5 which also acts as a mask during formation of the p-n junction of the diode.

Light may be incident on the device from either the substrate or top depending upon whether the device is mounted for substrate or top entry. In order to enable the incident light to reach the active layer the outer layers through which it must travel need to be transparent (i.e. have a band gap larger than the energy of the incident light).

Referring in detail to the particularly preferred structure of FIG. 1, the substrate 1 comprises n type indium phosphide doped with tin to a level of about $2 \times 10^{18}$ cm$^{-3}$, and this is followed by a nominally undoped buffer layer 2 of indium phosphide that has impurities giving rise to a carrier concentration of about $10^{16}$ cm$^{-3}$.

The third layer 3, which constitutes the active layer for carrier generation is preferably a ternary material such as InGaAs which is nominally undoped but is rendered n type to a level of about $10^{15}$-cm$^{-3}$ by background impurities and this is followed by a capping layer 4 of nominally undoped indium phosphide which is usually n type at a level of less than $10^{15}$-cm$^{-3}$. These layers may all be grown by metal organic vapour phase epitaxial methods.

After the capping layer a dielectric mask layer 5 is applied to the surface and a window 6 is formed by conventional techniques such as photolithography. Over the wafer many windows for separate devices may be formed. The mask layer is preferably silicon nitride although other dielectric materials including glass or silicon dioxide may be used. A p type region 7 is then formed in the layers 3 and 4 by zinc diffusion. At the indium phosphide layer surface the carrier concentration is p type of the order of $10^{18}$ cm$^{-3}$. In the ternary material it may be higher, reducing in the direction of the diffusion boundary where it reverts to the background n type at $10^{15}$ cm$^{-3}$.

Various methods for zinc diffusion are known, such as using the sealed ampoule technique, semi-open tube diffusion, or a spin-on glass paste, and further details are not given herein.

Figure 2:
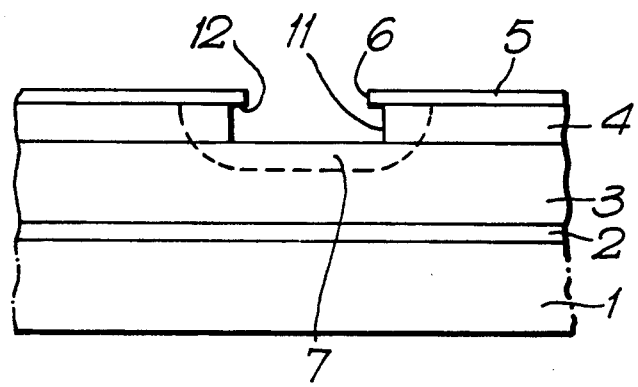
FIG. 2 shows a preferred fabrication step.

Referring to FIG. 2, a selective etchant such as a 1:3 mixture of HCl and H$_3$PO$_4$ is then used to remove the indium phosphide in the window 6.

The result of the etching step, using the window 6 in the mask layer 5, is to create a window 11 in the indium phosphide layer 4 which is in register with the window 6 in the passivation layer 5. That is, the boundaries of the two windows 6, 11 either correspond, or the window 6 in the passivation layer 5 shows an overhanging lip 12 of substantially constant width with respect to the window 11 in the indium phosphide layer 4.

Figure 3:
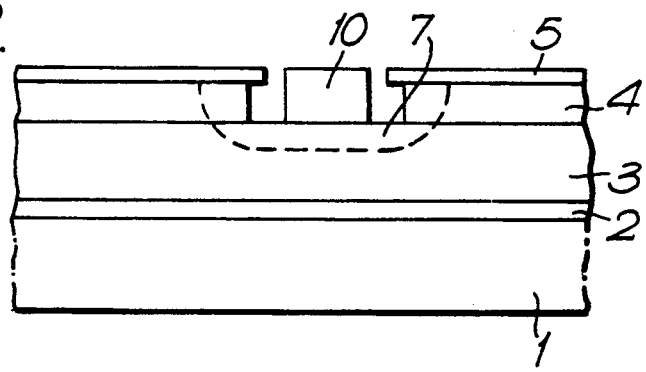
FIG. 3 shows a preferred embodiment of a completed device.

Referring to FIG. 3, once the ternary layer has been exposed by the selective etchant, a layer 10 of titanium is deposited and selectively etched to cover the region of the window 6 to provide the first layer of a titanium/gold contact. After this stage, the role of the mask layer 5 is as a dielectric layer, acting to control current flow from the active layer 3 in use of the diode.

Figure 4:
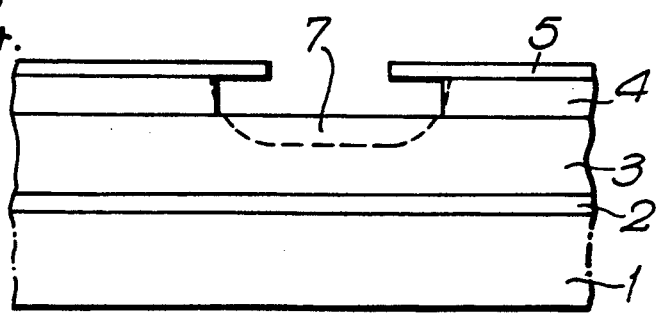
FIG. 4 shows an overetched fabrication step.

Although the etchant used to remove the indium phosphide capping layer 4, to create a window 11, will stop or proceed at a significantly lower rate on the ternary material, care needs to be taken not to permit excessive undercutting etching of the indium phosphide towards or even past the junction in the ternary active layer 3. The risk is exaggerated because the indium phosphide is etched substantially along a vertical plane while the profile of the junction in the indium phosphide is substantially hemispherical. FIG. 4 schematically shows the result of overetching leading to exposure of the junction in the ternary layer.

Figure 5:
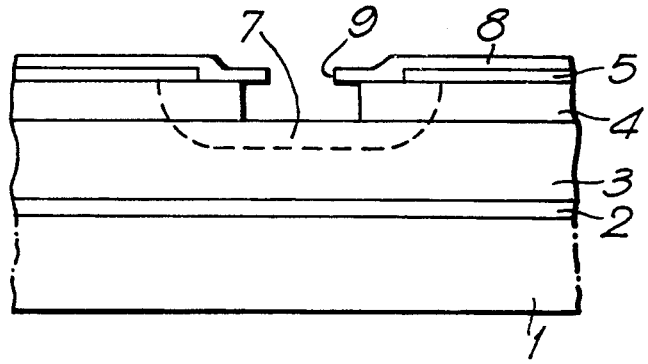
FIG. 5 shows an alternative preferred fabrication step.

Referring to FIG. 5, in order to reduce the risk associated with overetching the indium phosphode capping layer 4, alternatively a second mask 8 providing a smaller window 9 may be used.

This second mask 8 may be applied over the first mask layer 5 for instance after the p type region 7 has been formed. By subsequently etching the indium phosphide layer 4 through the smaller window 9 of the second mask 8, it will be seen that there is a greater margin for overetch of the indium phosphide layer 4 without the junction being too closely approached. The second mask 8 may also provide an improvement in the passivation of the device.

Figure 6:
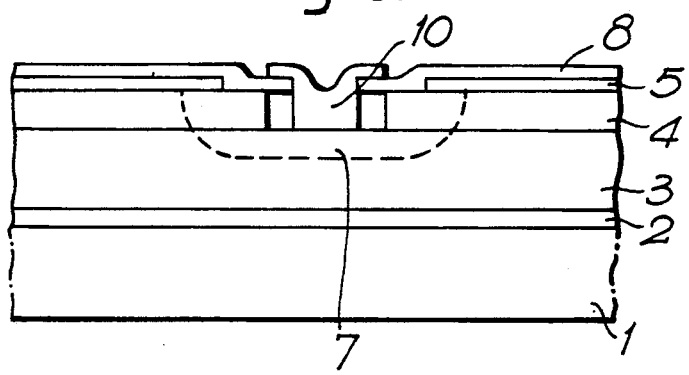
FIG. 6 shows an alternative preferred embodiment of a completed device, made by a method including the fabrication step of FIG. 5.

Referring to FIG. 6, deposition of the titanium layer 10 then results in an alternative structure to that shown in FIG. 3, having a double dielectric mask layer 5, 8.

The titanium layer 10 may be deposited and selectively etched within the perimeter of the window in the dielectric mask layer or layers 5, as shown in FIG. 3, or alternatively it may overlap the margin of the window, as shown in FIG. 6. These alternatives apply whether there is one mask layer 5 only, or two mask layers 5, 8.

Figure 7:
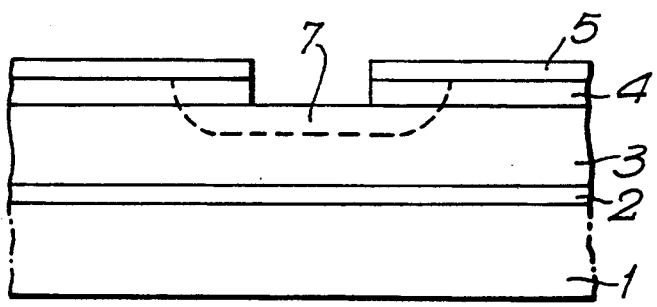
FIG. 7 shows another alternative fabrication step.

An alternative to diffusing the zinc dopant through the indium phosphide layer is for the indium phosphide layer to be removed in the window of mask layer 5 prior to diffusion. Without the use of a second dielectric mask, this latter technique provides a structure as shown in FIG. 7.

Instead of using zinc, other dopants may be used, such as cadmium.

The capping layer need not necessarily be of indium phosphide. For instance, if the layers of the wafer are grown by liquid phase epitaxial techniques the capping layer cannot be indium phosphide because of melt back problems. In this case a quaternary capping layer (InGaAsP) may be grown. Quaternary material however has a narrower band gap than indium phosphide and therefore the reduced transparency limits the detection wavelengths if the light entry is via the quaternary layer. Removal of the quaternary layer before or after diffusion may be performed in an analagous way to the indium phosphide removal using an appropriate etchant.

It will be realised that techniques other than diffusion may be used to form a selectively doped region within the active layer, for example ion implantation or selective area growth techniques. Likewise the window in the passivation layer may be formed by techniques other than wet etching processes, e.g. reactive ion etching or ion beam milling. Selective growth techniques may also be employed to form the window during growth.

I claim:

1. An optical semiconductor junction device comprising:
   an active layer having a surface,
   a capping layer overlying said active layer,
   a junction defined by the boundary of a volume selectively doped with a dopant to lie at least partially in the active layer and to extend into the capping layer,
   a window being defined in the capping layer exposing a part of the surface of the active layer within the boundary of the selectively doped volume, and
   an electrical contact layer deposited on at least a part of the active layer exposed by the window and providing an ohmic electrical contact to said active layer.

2. A junction device according to claim 1 in which the selectively doped volume comprises a diffused p region in a ternary n type active layer.

3. A junction device according to either one of claims 1 or 2 in which the dopant is zinc.

4. A junction device according to either one of claims 1 or 2 in which the dopant is cadmium.

5. A junction device according to claim 1 or 2 in which the capping layer comprises indium phosphide.

6. A junction device according to claim 1 or 2 in which the active layer comprises InGaAs.

7. A junction device according to claim 1 or 2 in which the contact layer comprises titanium.

8. A junction device according to claim 1 or 2 which further comprises a dielectric layer overlying the capping layer, which dielectric layer has a window therethrough in register with, and no larger than, the window in the capping layer.

9. A junction device according to claim 8 which further comprises a second dielectric layer, overlying the first dielectric layer, which second dielectric layer has a window therethrough which is smaller than the window in the first dielectric layer, and in register therewith.

10. A device as in claim 1 wherein said doped volume extends into said overlying capping layer.

11. A semiconductor junction device as in claim 1 wherein said electrical contact layer comprises:
a gold layer; and
barrier layer means disposed within said window in direct contact with said active layer surface for preventing said gold layer from passing into said active layer surface.

12. A device as in claim 1 wherein said electrical contact layer comprises a titanium layer disposed directly on said active layer surface.

13. A planar optical semiconductor junction device comprising:
an active layer of first conductivity, said active layer defining a planar surface;
a doped region of second conductivity disposed at least partially within said active layer and extending to a portion of said active layer planar surface, a p-n junction being formed by said active layer and said doped region;
a capping layer disposed on said active layer planar surface, said capping layer having a window therethrough exposing said active layer planar surface portion; and
an electrical contact layer disposed on said active layer planar surface portion within said window and providing an ohmic electrical contact thereto.

14. A device as in claim 13 wherein said doped region extends into said capping layer.

15. A device as in claim 13 wherein said doped region defines a boundary, and said window exposes said active layer planar surface within said boundary.

16. A device as in claim 13 wherein said electrical contact layer comprises a titanium layer disposed directly on said active layer planar surface.

17. A top-entry photodiode semiconductor structure including:
a substrate;
an active layer of a first semiconductor material disposed on said substrate, said active layer having an upper surface, said first semiconductor material having a first band gap;
a capping window layer of a second semiconductor material disposed on said active layer upper surface, said capping window layer having a window therethrough exposing said active layer upper surface, said second semiconductor material having a second band gap larger than said first band gap;
a doped region partially disposed within said active layer and partially disposed within said capping window layer, a p-n junction being formed by said active layer and said doped region; and
an ohmic electrical contact layer disposed within said window in direct contact with said active layer upper surface.

18. In a photodiode semiconductor structure of the type including:
an active layer having a planar upper surface,
a capping layer disposed on said planar upper surface,
a doped region formed within said active layer and said capping layer, a p-n junction formed by said doped region and said active layer,
an insulating layer disposed on said capping layer, said insulating layer defining a window therethrough, and
an electrical contact layer disposed within said insulating layer window for providing electrical contact to said doped region,
the improvement comprising:
structure defining a window through said capping layer exposing a portion of said doped region within said active layer, said electrical contact layer being disposed within both said insulating layer window and said capping layer window and directly contacting said active layer planar upper surface.

19. A photodiode semiconductor structure as in claim 18 wherein said capping layer window has edges and said insulating layer includes a lip which overhangs said capping layer window edges.

20. A photodiode semiconductor structure as in claim 18 wherein said electrical contact layer includes a titanium layer deposited on at least part of said active layer planar upper surface.

21. A photodiode semiconductor structure as in claim 18 wherein said electrical contact layer comprises:
a gold layer; and
barrier layer means disposed within said capping layer window in direct contact with said active layer upper surface for preventing said gold layer from contacting said active layer upper surface.

22. A substrate entry photodiode semiconductor structure including:
a light absorbing layer of InGaAs for receiving and absorbing incident light, said light absorbing layer having a planar upper surface;
an InP substrate supporting said light absorbing layer;
a capping layer of InP or InGaAsP disposed on said light absorbing layer planar upper surface;
a doped region formed in said light absorbing layer and said capping layer, a p-n junction existing between said doped region and said light absorbing layer;
dielectric layer means disposed on said capping layer, said dielectric layer including a window therethrough exposing said light absorbing layer upper surface;
an electrical contact layer disposed within said dielectric layer window, said contact layer providing an ohmic electrical contact to said doped region; and
a window through said capping layer substantially in registration with said dielectric layer window, said capping layer window exposing a portion of said doped region within said light absorbing layer, said electrical contact layer being disposed within both said insulating layer window and said capping layer window and directly contacting said light absorbing layer planar upper surface.

23. A structure as in claim 13 wherein said active layer comprises light absorbing material.

24. A structure as in claim 17 wherein said active layer comprises light absorbing material.

25. A structure as in claim 18 wherein said active layer comprises light absorbing material.

26. A structure as in claim 18 wherein said electrical contact layer provides an ohmic contact to said active layer.

* * * * *

UNITED STATES PATENT AND TRADEMARK OFFICE
CERTIFICATE OF CORRECTION

PATENT NO. : 5,144,396

DATED : September 1, 1992

INVENTOR(S) : Stephen K. Sargood

It is certified that error appears in the above-identified patent and that said Letters Patent is hereby corrected as shown below:

Title page, item [73] Assignee, "British Telecommunications public limited company, London, England" should be deleted and -- BT&D Technologies Limited, Ipswich, Suffolk, England -- should be inserted.

Signed and Sealed this

Thirtieth Day of November, 1993

Attest:

BRUCE LEHMAN

*Attesting Officer*  *Commissioner of Patents and Trademarks*